US005304452A

United States Patent [19]

Ohno et al.

[11] Patent Number: 5,304,452

[45] Date of Patent: Apr. 19, 1994

[54] HEAT SENSITIVE DIAZO TYPE RECORDING MATERIAL UTILIZING MICROENCAPSULATED DIAZO COMPOUND AND A COUPLING COMPONENT

[75] Inventors: Makoto Ohno; Akihiro Shimomura; Toshiharu Tanaka, all of Shizuoka, Japan

[73] Assignee: Fuji Photo Film Co., Ltd., Kanagawa, Japan

[21] Appl. No.: 958,751

[22] Filed: Oct. 9, 1992

[30] Foreign Application Priority Data

Oct. 9, 1991 [JP] Japan ................................ 3-290852

[51] Int. Cl.[5] ......................... G03C 5/18; G03F 7/021

[52] U.S. Cl. .................................... 430/138; 430/151; 430/157; 430/292; 430/336; 430/337; 430/338

[58] Field of Search ............... 430/138, 151, 157, 292, 430/336, 337, 338

[56] References Cited

U.S. PATENT DOCUMENTS

| | | | |
|---|---|---|---|
| 4,529,681 | 7/1985 | Usami et al. | 430/138 |
| 4,758,495 | 7/1988 | Yamaguchi et al. | 430/138 |
| 4,895,826 | 1/1990 | Watanabe et al. | 430/138 |
| 4,956,251 | 9/1990 | Washizu et al. | 430/138 |
| 4,965,166 | 10/1990 | Hosoi et al. | 430/138 |
| 4,975,353 | 12/1990 | Watanabe et al. | 430/138 |
| 5,047,308 | 9/1991 | Usami | 430/138 |
| 5,215,855 | 6/1993 | Keoshkerian | 430/138 |
| 5,223,370 | 6/1993 | Sacripante et al. | 430/138 |

*Primary Examiner*—Charles L. Bowers, Jr.
*Assistant Examiner*—Christopher G. Young
*Attorney, Agent, or Firm*—Sughrue, Mion, Zinn, Macpeak & Seas

[57] ABSTRACT

A recording material comprising a support coated with a photosensitive layer comprising a photosensitive diazo compound enclosed in microcapsules and a coupling component. The microcapsules are produced by forming an organic solution containing the diazo compound and a wall monomer, and emulsifying the organic solution in an aqueous solution containing an anionic surface-active agent and polyvinylpyrrolidone to produce oil droplets containing the wall monomer. The wall monomer is polymerized to form a wall around the oil droplets. When heat is applied to the photosensitive layer under alkaline conditions, the coupling component reacts with the diazo compound to form a color.

10 Claims, No Drawings

HEAT SENSITIVE DIAZO TYPE RECORDING MATERIAL UTILIZING MICROENCAPSULATED DIAZO COMPOUND AND A COUPLING COMPONENT

FIELD OF THE INVENTION

The present invention relates to a recording material using a photosensitive diazo compound. More particularly, the present invention relates to a diazo-type recording material, in which the base texture has improved preservation stability.

BACKGROUND OF THE INVENTION

Recording and reproducing materials which utilize the photosensitivity of diazo compounds are widely used because they provide excellent performance at low cost. Three major types of photosensitive diazo compounds are known.

The first, known as the wet-developing type, includes a photosensitive layer comprising a diazo compound and a coupling component as main constituents provided on a support. The photosensitive layer is developed with an alkaline solution after the photo-sensitive layer is placed over an original to be reproduced and exposed to light.

The second, known as the dry developing type, is developed with ammonia gas.

The third, one known as the heat-developing type, has several variations, such as the type containing an ammonia gas generating agent like urea, which generates ammonia gas in the photosensitive layer by heating; the type containing in the photosensitive layer an alkaline salt of compounds like trichloroacetic acid which loses acidic characteristics by heating; or, the type which activates a diazo compound and a coupling component by thermal fusion using higher fatty-acid amides as coloring aids.

The wet-type recording materials are undesirable because additional entries cannot be recorded on the still wet material, and copied images cannot be stored for extended periods. In addition, difficulties in maintenance and control of the development process are a problem, such as replenishing and disposition of the developing agent due to its liquid form, and the large size of the equipment.

The dry-type materials also are undesirable because a liquid developer must be replenished during development, as with the wet type. Moreover, an ammonia gas absorbing device is required to prevent leakage of the generated gas to the outside, which in turn requires large equipment, and a strong odor of ammonia is present immediately after reproducing.

On the other hand, the heat-developing type, unlike the wet type and the dry type, does not require use of the developing liquid. However, underdevelopment and variable color tones may occur due to the required high developing temperature of 150° to 200° C. and temperature control tolerance of ±10° C. Thus, expensive equipment is required to ensure the reproduction of fine images. To tolerate such a high developing temperature, the diazo compound used in the heat-developing process should have high heat resistance, which is often a disadvantage in obtaining high density in recorded images.

Therefore, various attempts have been made to achieve low temperature development, between 90° and 30° C., but this decrease in development temperature resulted in a degradation of the shelf life of the recording materials. Thus, because of the difficulties caused by the high developing temperature, the heat-developing type has not yet become the most widely used diazo-type reproducing system, though it is anticipated that the heat-developing type has more advantages than the wet-type and the dry-type.

The needs of users of diazo recording materials are widely diversified. For example, not only reproduction of colored images on a white base is required, but a recording system must also produce hues of the base texture and colored images for particular applications. When the recording material is used for drawings or posters, a high quality image is required, and conventional recording materials could not meet such demands.

To obtain the necessary color density by heating a photosensitive layer comprising a diazo compound, a coupling component and a coloring aid provided on a support, formation of dyes by instant fusion, diffusion and dispersion and reaction of respective components by heating is required.

If such a recording material which enables development of colors at low temperature and production images of high density images were designed, coloring reactions would gradually occur at room temperature during storage before use. These reactions would contaminate the base texture with colors before development instead of keeping the base texture clean white as desired.

The above-mentioned problem of contamination during storage, which looks unsolvable at a glance, has been nearly solved by enclosing a diazo compound in microcapsules on the reproducing material in a photosensitive layer comprising a diazo compound, a coupling component and a coloring aid provided on a support, which can be developed by heating, as described in U.S. Pat. No. 4,529,681.

However, even with the microencapsulated materials the preservability of the recording material before use is insufficient, if images of considerably high density are required.

SUMMARY OF THE INVENTION

Therefore, an object of the present invention is to provide a diazo-type recording material which can produce images of high density, while providing a base texture which inhibits the occurrence of staining and exhibits improved preservability. Other objects of the present invention are apparent from the following detailed description and examples.

The above-described objects of the present invention are accomplished by a diazo-type recording material comprising a support having thereon a layer comprising a photosensitive diazo compound enclosed in microcapsules and a coupling component which reacts with the diazo compound by heating under basic conditions to develop a color. The microcapsules are formed by forming an organic solution containing a diazo compound and a wall monomer, emulsifying and dispersing the organic solution in an aqueous solution containing polyvinylpyrrolidone and an anionic surface-active agent, and then polymerizing the wall monomer to form a wall around the oil droplets.

DETAILED DESCRIPTION OF THE INVENTION

Polyvinylpyrrolidone which can be used in the present invention may be preferably polymers having an average molecular weight of from about 120,000 to 480,000.

Examples of the anionic surface-active agents include preferably salts of sulfuric acid esters such as sodium dodecyl sulfate; salts of sulfonic acids such as sodium dodecylbenzene sulfonate and aerosol OT; salts of phosphoric acid esters such as sodium dodecyl phosphate; ether carboxylates such as sodium salts of carboxylated polyoxyethylene tridecylether; and, polyoxyethylene alkyether sulfates such as sodium polyoxyethylene dodecyl ether sulfate. Of these anionic surface-active agents, salts of sulfonic acids such as sodium dodecylbenzenesulfonate are particularly preferred.

Diazo-compounds which can be used in the present invention may be suitably selected from known diazo compounds, which are subjected to coupling reactions with coupling components to develop colors. The diazo compounds are also photodecomposable compounds, such as diazonium salts, diazosulfonates and diazoamino compounds.

Of these diazo compounds, to obtain both photosensitivity and density of recorded images with the recording material of the present invention, preferred are diazonium salts represented by general formula $ArN_2^+X^-$, wherein Ar represents a substituted or unsubstituted aromatic group; $N_2^+$ represents a diazonium group; and $X^-$ represents an anion of an acid.

Specific examples of the diazonium salts useful in the present invention include 4-diazo-1-dimethylaminobenzene, 4-diazo-1-diethylaminobenzene, 4-diazo-1-dipropylaminobenzene, 4-diazo-1-methylbenzylaminobenzene, 4-diazo-1-dibenzylaminobenzene, 4-diazo-1-ethylhydroxyethylaminobenzene, 4-diazo-1-diethylamino-3-methoxybenzene, 4-diazo-1-dimethylamino-2-methylbenzene, 4-diazo-1-benzoylamino-2,5-diethoxybenzene, 4-diazo-1-morpholinobenzene, 4-diazo-1-morpholino-2,5-diethoxybenzene, 4-diazo-1-morpholino-2,5-dibutoxybenzene, 4-diazo-1-tolylmercapto-2,5-diethoxybenzene, and 4-diazo-1,4-methoxybenzoylamino-2,5-diethoxybenzene.

Specific examples of the acids which are used in forming the diazonium salts described above include $C_nF_{2n-1}COOH$, wherein n represents an integer of 1 to 9; $C_mF_{2m+1}SO_3H$, wherein m represents an integer of 1 to 9; boron tetrafluoride, tetraphenylboron, hexafluorophosphoric acid, aromatic carboxylic acid, and metal halides such as zinc chloride and stannic chloride.

Coupling components which can be used in the present invention are compounds which undergo coupling reactions with the diazo compounds under alkaline conditions to develop colors. Specific examples of the coupling components include resorcin, phluoroglycin, sodium 2,3-dihydroxynaphthalene-6-sulfonate, 1-hydroxy-2-naphthoic morpholinopropylamide, 1,5-dihydroxynaphthalene, 2,3-dihydroxynaphthalene, 2,3-dihydroxy-6-sulfanilnaphthalene, 2-hydroxy-3-naphthoic morpholinopropylamide, 2-hydroxy-3-naphthanilide, 2-hydroxy-3-amide, 2-hydroxy-3-naphthoctylamide, 2-hydroxy-3-naphtho-N-dodecyl-oxy-propylamide, 2-hydroxy-3-naphthotetradecylamide, acetanilide, acetoacetanilide, benzoylacetanilide, 1-phenyl-3-methyl-5-pyrazolone, 1-(2',4',6',-trichlorophenyl)-3-benzamido-5-pyrazolone, 1-(2',4',6',-trichlorophenyl)-3-anilino-5-pyrazolone and 1-phenyl-3-phenylacetamido-5-pyrazolone. These coupling components may be used in a combination of two or more to obtain colored images with a specific tone.

In the present invention, a basic substance, which acts as a coloring aid, may be preferably used as needed to make the color development system alkaline upon heat-development to facilitate the coupling reaction. As such a basic additive for heat-development, basic compounds slightly soluble or insoluble in water, or compounds which produce alkali upon heating may be used. Specific examples of the basic substances include nitrogen-containing compounds such as inorganic or organic ammonium salts, organic amines and amides, ureas and thioureas and derivatives thereof, thiazoles, pyrroles, pyrimidines, piperazines, guanidines, indoles, imidazoles, imidazolines, triazoles, morpholines, piperidines, amidines, formamidines and pyridines. These basic substances may be used in combination of two or more.

In order to conduct rapid and complete heat-development with lower energy, additional compounds may be incorporated into the photosensitive layer of the present invention. Examples of such energy saving additional compounds include phenol derivatives, naphthol derivatives, alkoxy-substituted benzenes, alkoxy-substituted naphthalenes, hydroxy compounds, amide compounds and sulfonamides. These compounds permit lowering the melting point of a coupling component or a basic substance or improve heat transmission through the wall of the microcapsules; and, as a result, act as a coloring aid, producing colored images of high density.

The coloring aids of the present invention may also include thermally fusible substances. The thermally fusible substances are solids at ordinary temperature, melt by heating to a melting point of 50° to 150° C., and are capable of dissolving diazo compounds, coupling components or basic substances. Specific examples of the thermally fusible substances described above include fatty-acid amides, N-substituted fatty-acid amides, ketone compounds, urea compounds and esters.

The microcapsules of the present invention may be produced by forming oil droplets containing the diazo compound as a core substance, and a wall monomer emulsifying and dispersing the oil droplets in an aqueous solution containing the anionic surfactant and polyvinylpyrrolidone, and then forming a wall of polymeric material around the oil droplets by polymerizing the wall monomer. Reactants which are used in forming the polymeric material may be incorporated into the inside and/or outside of the oil droplets.

Specific examples of the polymeric materials which may be used to form the microcapsules include polyurethanes, polyureas, polyamides, polyesters, polycarbonates, urea-formaldehyde resins and melamin resins. The polymeric substances may be used in combination of two or more thereof. Of these polymeric materials, preferred are polyurethanes, polyureas, polyamides, polyesters and polycarbonates, and more preferred are polyurethanes and polyureas. The polymeric materials preferably do not melt at recording temperature, and have a melting point of 150° C. or more. The microcapsules of the present invention may be preferably produced from an emulsion containing the component intended to be the microcapsules in an amount of 0.2% by weight or more on the basis of the total weight of the emulsion.

According to the present invention, a coupling component and a coloring aid may be used in an amount of from 0.1 to 10 parts by weight and from 0.1 to 20 parts by weight, respectively, on the basis of 1 part by weight of a diazo compound used herein. A diazo compound may be preferably used in an amount of 0.05 to 5.0 g/m$^2$ in the terms of the area of the coating of the photosensitive layer. In preparing the microcapsules of the present invention, polyvinylpyrrolidone and an anionic surface-active agent may be preferably used in an amount of from 0.5 to 20 parts by weight and from 0.05 to 1 part by weight, respectively, with respect to part by weight of a diazo compound used herein.

The microcapsules which can be used in the present invention should preferably be substantially free from solvents. For example, microcapsules may be obtained by dissolving a diazo compound, a coupling component, and a monomer destined to form the wall of the microcapsules in a nonaqueous solvent with low boiling point. The dissolution is followed by polymerizing the monomer therein while distilling the solvent off therefrom. When the monomer is polymerized as described above to produce the polymer for forming the wall of the microcapsules, the monomer may be used in such an amount to obtain microcapsules having an average particle diameter of from 0.3 to 12 μm and also a wall thickness of from 0.01 to 0.3 μm. The diazo compound can be securely enclosed in the microcapsules thus obtained; therefore, this strictly prevents the diazo compound from coming in contact with any coupling component at ordinary temperature, different from the case in the previous systems.

In the recording material of the present invention, coupling components, basic substances and other coloring aids, which can not be incorporated in the microcapsules, may be preferably incorporated into the photosensitive layer after they are dispersed in the solid state, with a water-soluble polymer, using a sand mill or the like. Preferred as water-soluble polymers used herein are those which are used to prepare the microcapsules, as described in, for example JP-A-59-190886 (The term "JP-A" as used herein means an "unexamined published Japanese patent application). In this case, a coupling component and a coloring aid each may be used in an amount of from 5 to 40% by weight on the basis of a water-soluble polymer solution. The size of the resulting dispersed particles may be preferably 10 μm or less.

A coating composition for forming a photosensitive layer of the present invention can be applied by various known coating methods. Examples of the coating methods which can be employed herein include bar coating, blade coating, air knife coating, gravure coating, doctor coating, slide coating, roll coating, spray coating, dip coating, curtain coating and other coating methods which are described in "Coating Engineering" by Yuji Harazaki (published by Asakura Shoten in 1973) page 253. According to the present invention, the photosensitive layer used herein may be formed by regulating the coating amount in the range of from 2.5 to 30 g/m$^2$ on a dry solid content basis after coating.

In the recording material of the present invention, various components such as a diazo compound, a coupling component and a basic substance may be present in the same layer as described above, or may be present in various layers; for example, to form a laminate structure. Furthermore, the photosenstive layer of the present invention may be applied onto a support after providing an intermediate layer thereon as described in JP-A-61-54980, or a protective layer may be additionally provided on the photosensitive layer.

In forming images using the recording material according to the present invention, the material laid over an original to be reproduced may be imagewise exposed to light corresponding to the original to decompose the diazo compound present in the exposed areas thereof. Then, the entire material may be heated to allow the diazo compound remaining and coupling component present in the unexposed areas thereof to react, thus producing colored images. Alternatively, after imagewise thermo-recording using a heat pen or thermal head, the entire surface of the material may be exposed to light to decompose the diazo compound remaining in the uncolored areas thereof, resulting in fixing.

Imagewise photoexposure, allowing the original to be reproduced, may be performed by simply photoexposing the present recording material thus obtained in close contact with and laid over the original to be reproduced, if the original is transparent. Exposure using other means, such as laser, may alternatively be used to expose the recording material. Examples of light sources to which the present recording material can be exposed to produce images include various fluroescent lamps, xenon lamps and mercury lamps. In these cases the emission spectrum of a light source is desired to be nearly equal to the adsorption spectrum of a diazo compound used herein.

Examples of the heating means used in heat-developing the entire surface of recording material of the present invention include heaters such as infrared heaters, high frequency heaters, heat blocks and heat rollers.

The diazo-type recording material according to the present invention can strictly prevent the diazo compound in the photosensitive layer from coming in contact with the coupling component at ordinary temperature by providing the microcapsules with the special wall of the present invention which surrounds the diazo compound, thus producing colored images of high density while providing extremely satisfactory preservability of the raw recording material.

The present invention will be explained in greater detail with reference to the following examples, but the present invention should not be construed as being limited thereto. The parts used hereinafter are by weight unless otherwise indicated.

EXAMPLE 1

Preparation of Capsule Liquid

Added to 13 parts of ethyl acetate was 3 parts of diazonium salt represented by the following formula:

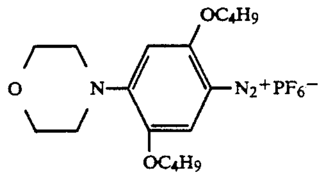

to form a solution. Subsequently added to the solution was 10 parts of 75% by weight ethyl acetate solution of a 1:3 adduct of trimethylolpropane and xylylenediisocyanate (trade name: Takenate D110N; manufactured by Takeda Yakuhin Kogyo Co., Ltd.) represented by the following formula:

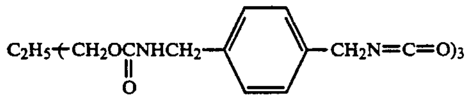

with stirring to form a mixture. Then added to the ethyl acetate solution thus obtained containing the diazonium salt and isocyanate compound was an aqueous solution which was obtained by dissolving 3.5 parts of polyvinylpyrrolidone (trade name: PVP K-90; manufactured by GAF Co., Ltd.) represented by the following formula:

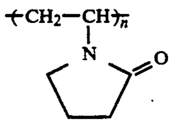

and 0.5 part of sodium dodecylbenzenesulfonate in 60 parts of water to form a composition which was then emulsified and dispersed, thus resulting in an emulsion having an average particle diameter of 1.0 μm. The resulting emulsion was mixed with 20 parts of water and then heated to 40° C. with stirring to allow the isocyanate to react over a period of 3 hours for forming a wall, thus resulting in microcapsules having an average particle diameter of 1 μm and containing the diazo compound as a core substance. The microencapsulation reaction described above was performed under reduced pressure ranging from 400 to 500 mmHg using a water-jet pump.

Preparation of Coupler Dispersion

Added to 100 parts of 5% by weight aqueous solution of polyvinyl alcohol were 5 parts of 2-hydroxy-3-naphthanilide and 5 parts of triphenylguanidine to form a mixture which was dispersed over a period of 24 hours using a sand mill to obtain a dispersion having an average particle diameter of 3 μm.

Preparation of Coating Composition

Added to 8 parts of the capsule liquid containing the diazonium salt thus obtained were 25 parts of the dispersion containing the coupling component and triphenylguanidine, 2 parts of a dispersion of 40% by weight calcium carbonate (trade name: Unibar 70; manufactured by Shiraishi Kogyo Co., Ltd.) and 0.5 part of water to form a coating composition.

Preparation of Recording Material

The resulting coating composition as described above was bar-coated on a smooth sheet of quality paper (76 $g/m^2$) in a coating amount of 5 $g/m^2$ on a dry basis using a coating bar and then dried over a period of 3 minutes at 50° C. to obtain a recording material.

Evaluation of Preservability

For the purpose of evaluating preservability (during storage) of the raw recording material thus obtained which was not yet exposed, the material was subjected to forced deterioration testing under an atmosphere of 40° C., 90% RH (Relative Humidity) and of 60° C., 30% RH, respectively, in darkness to determine the density of the base texture thereof using a Mcbeth densitometer. A change in density was observed before and after testing. The values in density of the base texture observed herein were 0.11 before testing and 0.12 after testing at 40° C., 90% RH and 0.11 after testing at 60° C., 30% RH. The results show no deterioration at all. In addition, the measured densities of recorded images observed herein were 1.25 before and after testing.

EXAMPLE 2

A recording material was prepared and the deterioration testing of the material thus obtained was conducted in the same manner as in Example 1 except for using sodium dodecylsulfate in place of sodium dodecylbenzenesulfonate. The values in density of the recorded images and the base texture before testing observed herein were 1.25 and 0.11, respectively, both of which were the same as those observed in Example 1. The values in density of the base texture after testing observed herein were 0.14 at 40° C., 90% RH and 0.12 at 60° C., 30% RH. The results show that the material obtained herein is satisfactory for use in recording.

COMPARATIVE EXAMPLE 1

A recording material was prepared and the deterioration testing of the material thus obtained was conducted in the same manner as in Example 1 except for using polyvinyl alcohol in place of polyvinyl pyrrolidone. The values in density of the recorded images and the base texture before testing observed herein were 1.25 and 0.11, respectively, both of which were the same as those observed in Example 1. On the other hand, the values in density of the base texture after testing observed herein were 0.26 at 40° C., 90% RH and 0.21 at 60° C., 30% RH, respectively. The results show the occurrence of marked deterioration.

COMPARATIVE EXAMPLE 2

A recording material was obtained and the deterioration testing of the material thus obtained was conducted in the same manner as in Example 1 except for using no sodium dodecylbenzenesulfonate. The results show that emulsification for microencapsulation intended herein is infeasible, thus failing to prepare microcapsules.

COMPARATIVE EXAMPLE 3

A recording material was obtained and the deterioration testing of the material thus obtained was conducted in the same manner as in Example 1 except for using polyoxyethylene-n-dodecyl ether in place of sodium dodecylbenzenesulfonate. The results show that emulsification for microencapsulation intended herein is infeasible, thus failing to prepare microcapsules.

COMPARATIVE EXAMPLE 4

A recording material was obtained and the deterioration testing of the material thus obtained was conducted in the same manner as in Example 1 except for using dodecyltrimethylammonium chloride in place of sodium dodecylbenzenesulfonate. The results show that emulsification for microencapsulation intended herein is infeasible, thus failing to prepare microcapsules.

COMPARATIVE EXAMPLE 5

A recording material was obtained and the deterioration testing of the material thus obtained was conducted in the same manner as in Example 1 except for using only polyvinyl alcohol in place of polyvinyl pyrrolidone and sodium dodecylbenzenesulfonate. The values in density of the recorded images and the base texture before testing observed herein were 1.24 and 0.11, respectively, the latter of which was the same as that observed in Example 1. On the other hand, the values in density of the base texture after testing observed herein were 0.19 at 40° C., 90% RH and 0.16 at 60° C., 30% RH. The results show that the material obtained exhibits poor preservability compared to that of Example 1.

Representative results obtained by the deterioration testing are summarized in Table 1.

TABLE 1

| | Before Deterioration Testing | | After Deterioration Testing (24 Hours) Density of Base Texture | |
|---|---|---|---|---|
| Recording Material | Density of Recorded Images | Density of Base Texture | 40° C., 90% RH | 60° C., 30% RH |
| Example 1 | 1.25 | 0.11 | 0.12 | 0.11 |
| Example 2 | 1.25 | 0.11 | 0.14 | 0.12 |
| Comparative Example 1 | 1.25 | 0.11 | 0.26 | 0.21 |
| Comparative Example 5 | 1.24 | 0.11 | 0.19 | 0.16 |

The results set forth in Table 1 show that the recording material obtained by using polyvinyl pyrrolidone and an anionic surface-active agent as emulsifying agents in preparing the microcapsules according to the present invention produces images of sufficiently high density while providing much improved preservability of the raw recording material.

While the invention has been described in detail and with reference to specific embodiments thereof, it will be apparent to one skilled in the art that various changes and modifications can be made therein without departing from the spirit and scope thereof.

What is claimed is:

1. A recording material comprising a support having coated thereon a photosensitive layer comprising:

(a) a photosensitive diazo compound enclosed in microcapsules, said microcapsules being formed by forming an organic solution containing said diazo compound and a wall monomer, emulsifying said organic solution in an aqueous solution containing an anionic surface-active agent and polyvinylpyrrolidone to produce oil droplets containing said wall monomer, and polymerizing said wall monomer to form a wall around said oil droplets; and, (b) a coupling component, wherein said coupling component reacts with said diazo compound to form a color upon application of heat to said photosensitive layer under alkaline conditions.

2. A recording material as claimed in claim 1, wherein said polyvinylpyrrolidone has an average molecular weight of from about 120,000 to 480,000.

3. A recording material as claimed in claim 1, wherein said surface-active agent is sodium dodecylbenzenesulfonate.

4. A recording material as claimed in claim 1, wherein said diazo compound is a diazonium salt represented by the general formula:

$$ArN_2^+X^-$$

wherein Ar represents a substituted or unsubstituted aromatic group; $N_2^+$ represents a diazonium group, and $X^-$ represents an anion of an acid.

5. A recording material as claimed in claim 1, wherein said coupling component is present in an amount of 0.1 to 10 parts by weight with respect to 1 part by weight of said diazo compound.

6. A recording material as claimed in claim 1, wherein said photosensitive layer further comprises coloring aids in an amount of 0.1 to 20 parts by weight with respect to 1 part by weight of said diazo compound.

7. A recording material as claimed in claim 1, wherein said polyvinylpyrrolidone is used in an amount of 0.5 to 20 parts by weight with respect to 1 part by weight of said diazo compound.

8. A recording material as claimed in claim 1, wherein said surface-active agent is used in an amount of 0.05 to 1 parts by weight with respect to 1 part by weight of said diazo compound.

9. A recording material as claimed in claim 1, wherein said diazo compound is used in an amount of 0.05 to 5 $g/m^2$ of said photosensitive layer.

10. A recording material as claimed in claim 1, wherein said microcapsules have an average particle diameter of 0.3 to 12 μm.

* * * * *